United States Patent [19]

Friske et al.

[11] Patent Number: 5,208,865
[45] Date of Patent: May 4, 1993

[54] MUTING CIRCUIT USING COMMON MODE REJECTION OF DIFFERENTIAL AMPLIFIER

[75] Inventors: James W. Friske, Northville; Andrew C. Krochmal, Plymouth, both of Mich.

[73] Assignee: Ford Motor Company, Dearborn, Mich.

[21] Appl. No.: 812,337

[22] Filed: Dec. 23, 1991

[51] Int. Cl.⁵ .......................................... H04B 15/00
[52] U.S. Cl. ....................................... 381/94; 381/86; 381/107; 455/212; 455/221
[58] Field of Search ..................... 381/86, 107, 94; 455/221, 222, 212, 225

[56] References Cited

U.S. PATENT DOCUMENTS

| | | | |
|---|---|---|---|
| 4,288,753 | 9/1981 | Babano | 330/51 |
| 4,366,441 | 12/1982 | Nishimura | 330/51 |
| 4,390,847 | 6/1983 | Yamada et al. | 330/51 |
| 4,703,507 | 10/1987 | Holden | 455/225 |
| 4,736,434 | 4/1988 | Filliman | 358/144 |
| 4,759,065 | 7/1988 | Field et al. | 381/98 |
| 4,975,963 | 12/1990 | Liberman | 381/83 |
| 4,979,218 | 12/1990 | Strahm | 381/94 |
| 4,983,927 | 1/1991 | Torazzina | 330/51 |

Primary Examiner—Jin F. Ng
Assistant Examiner—Edward Lefkowitz
Attorney, Agent, or Firm—Mark Mollon; Roger L. May

[57] ABSTRACT

Differential signals are employed in a distributed audio system to improve noise immunity of the low level differential signals transmitted between a main unit and a power amplifier. The power amplifier may be in an auxiliary output unit which is locally muted by employing a field-effect transistor connected between the differential signals. When the field-effect transistor is turned on by a mute signal, the common mode rejection of the differential amplifier is employed to mute the amplifier output.

11 Claims, 2 Drawing Sheets

MUTING CIRCUIT USING COMMON MODE REJECTION OF DIFFERENTIAL AMPLIFIER

BACKGROUND OF THE INVENTION

The present invention relates in general to an inexpensive and reliable muting circuit for audio amplifiers with differential inputs and more specifically to an audio system having a main output section and an auxiliary output section wherein a differential amplifier in the auxiliary section is muted separately from the main output section.

High performance automotive audio systems frequently employ a power amplifier located remotely from the main audio unit in the dashboard. By distributing the system components throughout the vehicle, the limited dashboard space is conserved and the amount of heat that would otherwise be generated in the main unit is reduced.

In such a distributed system, audio signals supplied from the main unit to the remote power amplifier are characterized by a low voltage level. Because of the distance traversed by the signal lines between the main unit and the power amplifier and because of the low level of the audio signals, the signal which is input to the power amplifier tends to include an undesirable amount of noise signal.

To solve the problem of conducting low level signals within the relatively noisy environment of an automobile, the audio signal has been conducted between the main unit and the power amplifier as a differential signal. Thus, a pair of electrical lines are used to conduct a signal and an inverted signal (i.e., identical but 180° out of phase). The signal and the inverted signal are provided to a differential amplifier which amplifies the difference between the two signals. The output of the differential amplifier equals the original signal multiplied by a constant and does not include noise picked up by the electrical lines since each line receives the same noise signal which then cancels out in the differential amplifier (known as the common mode rejection of the differential amplifier).

Audio systems typically employ muting to inhibit action by the power amplifier during times that no valid audio signal is being output by the main unit. Such times include periods when a radio is being scanned-tuned, a tape player is being rewound, or during power-up when loud pops caused by power-on transients occur. Such muting is especially desirable in auxiliary head phone units which tap off the main system to allow private listening or listening at increased volume without inconveniencing other passengers in a vehicle.

Power amplifiers are typically constructed using integrated circuits which are available from many manufacturers. Some integrated circuits are available which are internally muted under control of a mute signal supplied to a pin of the integrated circuit. However, internally muted integrated circuits may not be available for a particular application depending on desired power capacity and other requirements. Depending upon production volume, it may not be possible to obtain a custom made integrated circuit for a particular application so that a standard unmutable integrated circuit might be the only option. Therefore, a means is needed for externally muting an audio amplifier having differential inputs.

SUMMARY OF THE INVENTION

It is a principal object of the present invention to provide a simple, inexpensive, and reliable muting circuit for audio amplifiers with differential inputs.

It is another object of the invention to provide local muting of an auxiliary output section and an audio system for a vehicle.

These and other objects are achieved in a mutable audio system wherein an audio processor receives input audio signals and provides a low level differential signal across a pair of output terminals. A fixed gain differential amplifier has a pair of differential inputs coupled to receive the low level differential output signal. A pair of resistors are connected between a respective output terminal of the audio processor and a respective differential input of the differential amplifier. A field-effect transistor is connected between the differential inputs and receives a mute signal at the gate thereof. A controller is coupled to the field-effect transistor for generating the mute signal when the differential amplifier is to be muted.

BRIEF DESCRIPTION OF THE DRAWINGS

The novel features of the invention are set forth with particularity in the appended claims. The invention itself, however, both as to its organization and method of operation together with further objects and advantages thereof, may best be understood by reference to the following description taken in conjunction with the accompanying drawings in which:

DETAILED DESCRIPTION OF PREFERRED EMBODIMENTS

Figure 1:
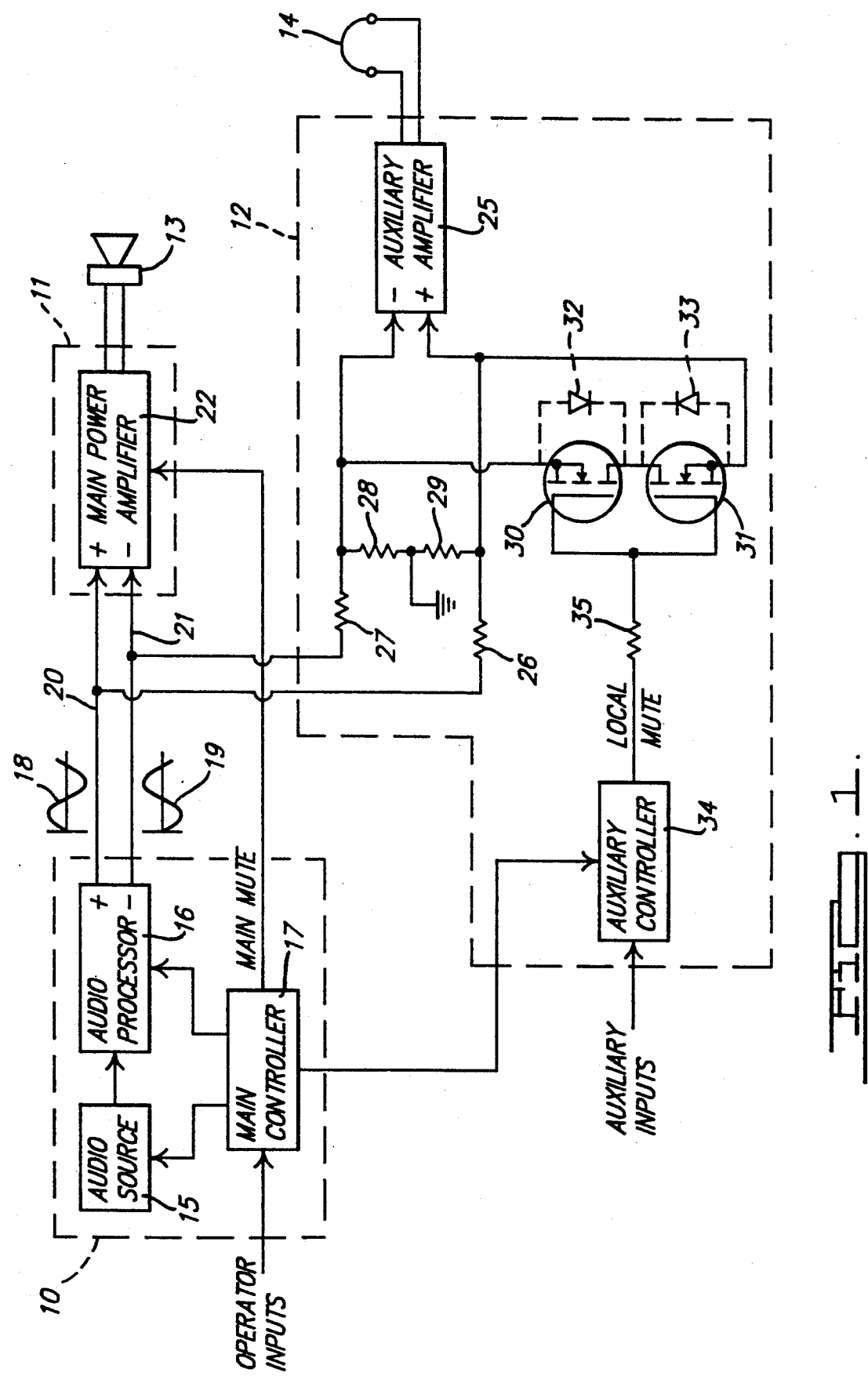
FIG. 1 is a part schematic, part block diagram showing an audio system according to the present invention.

In FIG. 1, an audio system is comprised of a main unit 10 connected with a main output section 11 and an auxiliary output section 12. Speaker 13 reproduces audio signals from the main output section 11 and may comprise a main speaker in a vehicular audio system. A head set 14 reproduces audio signals from auxiliary output section 12 and may comprise a rear seat listening station in a vehicle. For simplicity, a single audio channel is shown in FIG. 1 rather than all four front and rear stereo signals employed in a typical system.

Main unit 10 comprises an audio source 15 for providing audio signals which may include a radio tuner, a cassette player, a CD player and/or other audio sources. The audio signal is provided to an audio processor 16 which controls such audio parameters as volume, tone, and stereo balance. A main controller 17 receives operator inputs and is connected with audio source 15 and audio processor 16 to control their operation. Main controller 17 is typically comprised of a microcontroller.

Audio processor 16 provides differential audio signals to signal lines 20 and 21. Audio processor 16 includes a noninverted output for providing the audio signal in-phase as shown by waveform 18. An inverted output provides a signal 180° out-of-phase as shown by waveform 19.

Signal lines 20 and 21 are connected to main differential power amplifier 22 in main output section 11. Main differential power amplifier 22 may, for example, comprise an internally muted integrated circuit receiving a main mute signal from main controller 17.

Signal lines 20 and 21 are further connected to an auxiliary differential amplifier 25 through coupling resistors 26 and 27, respectively. A pair of resistors 28 and 29 are connected in series between the differential inputs of auxiliary amplifier 25. The junction of resistors 28 and 29 is connected to ground. Also connected across the differential inputs are a pair of n-channel enhancement mode MOSFETs 30 and 31 connected in series. MOSFETs 30 and 31 are inverse connected (e.g., their drain terminals are connected together as shown in FIG. 1) so that their inherent diodes 32 and 33 are connected in opposition.

Auxiliary output section 12 includes an auxiliary controller 34 which receives auxiliary inputs and exchanges control signals with main controller 17. A local mute signal from auxiliary controller 34 is coupled to the gate terminals of MOSFETs 30 and 31 through a resistor 35.

During normal unmuted operation of auxiliary output section 12, each differential output signal on lines 20 and 21, respectively, is reduced in voltage by voltage dividers comprised of resistors 26 and 29 and 27 and 28. Thus, an attenuated differential input signal is provided to auxiliary amplifier 25 so that the amplified output of fixed gain auxiliary amplifier 25 is at a level which is appropriate for headset 14.

When auxiliary output section 12 is to be muted, auxiliary controller 34 provides a local mute signal turning on MOSFETs 30 and 31. The on-resistance of MOSFETs 30 and 31 is very low (i.e., less than about 3 ohms and very much less than the resistance of resistors 26 and 27) substantially resulting in a short circuit between the differential inputs of amplifier 25. Due to the common mode rejection of amplifier 25, substantially no output signal is provided to headset 14.

MOSFETs are employed as the active elements in the muting circuit for several important reasons. The muting circuit is capable of muting all differential input signals down to zero volts since the MOSFETs behave in a purely resistive manner, whereas bipolar transistors cannot establish a short circuit at voltages less than the saturation voltage of the transistor ($V_{ce(sat)}$), thereby leaving such signals unmuted. Sec d MOSFETs do not require a DC bias for operation as do bipolar transistors. Finally, since MOSFETs draw very low current, they may be driven directly from a microcontroller output in auxiliary controller 34 through a resistor 35, whereas a bipolar transistor would require a complicated drive circuit to provide the saturation current of the transistor.

Auxiliary controller 34 generate's the local mute signal immediately upon powering up of the components of the audio system and for a predetermined time delay. This prevents transients or pops in the audio system from being reproduced on headset 14. The local mute signal can also be generated during scan tuning operations, rewind of a cassette tape, or other times when no valid audio output is being generated. Auxiliary controller 34 is interconnected with main controller 17 so that these actions can be initiated at the main unit or at the auxiliary output unit.

Figure 2:
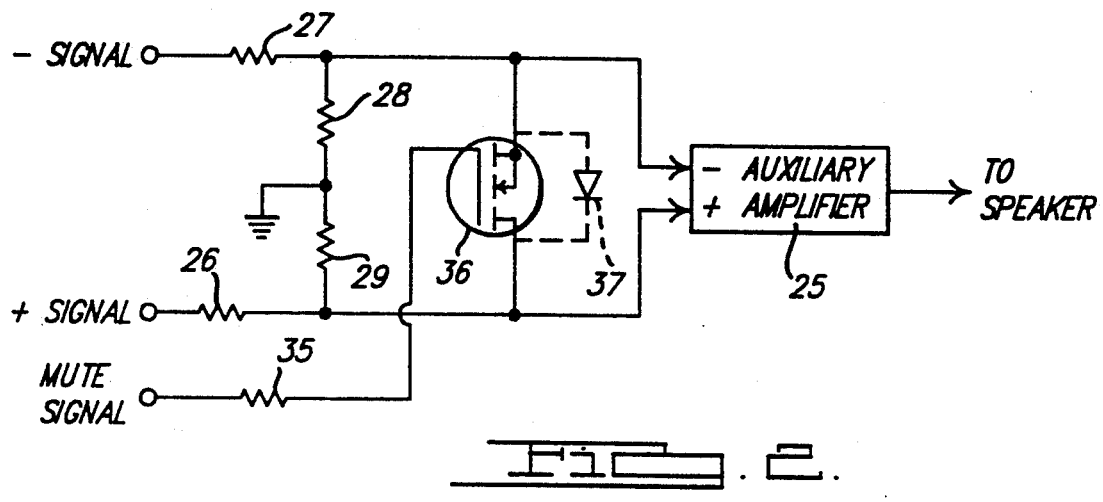
FIG. 2 is a schematic diagram of an alternate embodiment of the muting circuit of the present invention

FIG. 1 shows a pair of MOSFETs 30 and 31 inverse connected so that their inherent diodes 32 and 33 are connected in opposition. This allows differential signals greater than the threshold voltage of the inherent diodes 32 or 33 to be conducted to auxiliary amplifier 35 without being shunted through the inherent diodes. FIG. 2 shows an alternative embodiment wherein a single MOSFET 35 having an inherent diode 37 is employed to mute differential input signals. The embodiment of FIG. 2 has the advantage of reduced cost since only one MOSFET is employed. However, the magnitude of differential input signals must be limited to less than the threshold voltage of inherent diode 37 for proper operation.

Figure 3:
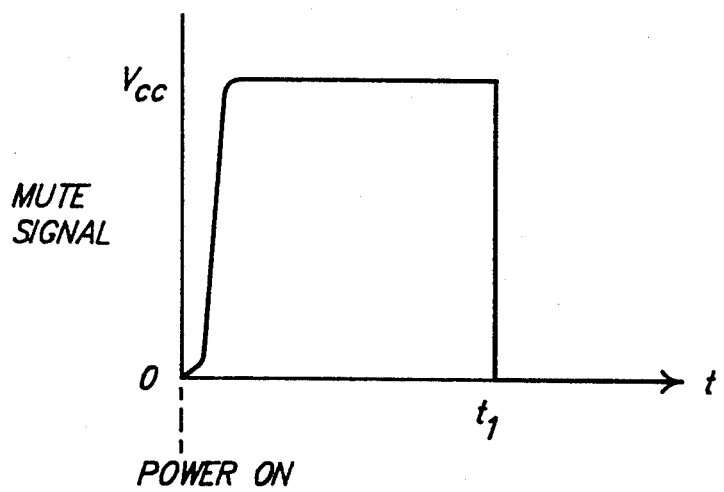
FIG. 3 is a waveform diagram showing the mute signal immediately after power-on of the audio system.

FIG. 3 shows a waveform for the local mute signal wherein the mute signal is generated immediately upon power-on of the audio system. A high logic level is thus provided at a voltage $V_{cc}$ (i.e., the supply voltage provided to auxiliary controller 34). After a time delay $t_1$ (after which all transients which might cause audible pops have dissipated), the mute signal is switched to a low logic level (i.e., zero volts) so that the amplifier is unmuted.

The foregoing has provided a mute circuit for use with differential inputs which is inexpensive, reliable, and uses few components. The muting circuit can work with positive, negative, or zero volt DC bias and can mute all signals down to zero volts. Although an external muting circuit has been described, the muting circuit of the present invention could also be integrated onto a differential amplifier integrated circuit. In addition, depletion mode MOSFETs could be used instead of enhancement mode, in which case the mute signal would have to be inverted.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. An audio system for a vehicle comprising:
    a source of audio signals to be reproduced;
    an audio processor coupled to said source and providing a low level differential output signal across a pair of output terminals;
    main controller means coupled to said source and said audio processor for controlling audio parameters of said low level differential output signal;
    primary output means coupled to said output terminals for amplifying said low level differential output signal and for reproducing sound in said vehicle; and
    auxiliary output means coupled to said output terminals for reproducing sound audible in a portion of said vehicle, said auxiliary output means comprising:
    a fixed gain differential amplifier having a pair of differential inputs coupled to receive said low level differential output signal;
    muting means coupled to said pair of differential inputs for selectably connecting together said differential inputs in response to a mute signal; and
    auxiliary controller means coupled to said muting means for generating said mute signal for a predetermined time when said audio processor is first activated.

2. The audio system of claim 1 wherein said muting means is comprised of a field-effect transistor connected between said differential inputs and receiving said mute signal at the gate thereof.

3. The audio system of claim 2 wherein said field-effect transistor is an enhancement-mode MOSFET.

4. The audio system of claim 1 wherein said muting means is comprised of a Pair of inverse-connected field-effect transistors connected between said differential inputs and receiving said mute signal at the gates thereof.

5. The audio system of claim 1 wherein said auxiliary output means comprises a headphone system, and wherein said auxiliary output means further includes a voltage divider for reducing the voltage of said low level differential output signal provided to said pair of differential inputs.

6. The audio system of claim 1 wherein said main controller means and said auxiliary controller means are coupled together to transmit control signals therebetween.

7. A mutable audio system comprising:
audio processor means for receiving input audio signals and providing a low level differential output signal across a pair of output terminals;
a fixed gain differential amplifier having a pair of differential inputs coupled to receive said low level differential output signal;
a pair of resistors, each respective resistor connected between a respective output terminal of said audio processor and a respective differential input;
a first field-effect transistor connected between said differential inputs and receiving a mute signal at the gate thereof; and
controller means coupled to said field-effect transistor for generating said mute signal when said audio system is to be muted.

8. The audio system of claim 7 wherein said first field-effect transistor is an enhancement-mode MOSFET.

9. The audio system of claim 7 further comprising a second field-effect transistor inverse connected with said first field-effect transistor and receiving said mute signal at the gate thereof.

10. The audio system of claim 9 wherein said first and second field-effect transistors are each an enhancement-mode MOSFET.

11. The audio system of claim 7 further comprising a speaker coupled to the output of said fixed gain differential amplifier.

* * * * *